(12) United States Patent
Ma et al.

(10) Patent No.: US 10,622,582 B2
(45) Date of Patent: Apr. 14, 2020

(54) SUBSTRATE FOR DISPLAY PANEL, MANUFACTURING METHOD THEREOF, DISPLAY PANEL AND ENCAPSULATION METHOD

(71) Applicant: BOE TECHNOLOGY GROUP CO., LTD., Beijing (CN)

(72) Inventors: Yinghai Ma, Beijing (CN); Yueping Zuo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/779,957

(22) PCT Filed: Sep. 22, 2017

(86) PCT No.: PCT/CN2017/102961
§ 371 (c)(1),
(2) Date: May 30, 2018

(87) PCT Pub. No.: WO2018/161536
PCT Pub. Date: Sep. 13, 2018

(65) Prior Publication Data
US 2019/0058152 A1 Feb. 21, 2019

(30) Foreign Application Priority Data
Mar. 6, 2017 (CN) .......................... 2017 1 0130775

(51) Int. Cl.
*H01L 51/52* (2006.01)
*H01L 51/00* (2006.01)
*H01L 51/56* (2006.01)

(52) U.S. Cl.
CPC ...... *H01L 51/5246* (2013.01); *H01L 51/0096* (2013.01); *H01L 51/56* (2013.01)

(58) Field of Classification Search
CPC .. H01L 51/5246; H01L 51/0096; H01L 51/56
See application file for complete search history.

(56) References Cited

U.S. PATENT DOCUMENTS 5,619,097 A * 4/1997 Jones ................. G02B 27/2235
313/309
5,701,055 A 12/1997 Nagayama et al.
(Continued)

FOREIGN PATENT DOCUMENTS

CN 101271832 A 9/2008
CN 101866944 A 10/2010
(Continued)

OTHER PUBLICATIONS

Search Report and Written Opinion for International Application No. PCT/CN2017/102961 dated Dec. 25, 2017.
(Continued)

*Primary Examiner* — Ida M Soward
(74) *Attorney, Agent, or Firm* — Calfee, Halter & Griswold LLP

(57) ABSTRACT

Disclosed is a substrate for a display panel, a manufacturing method thereof, and a display panel and encapsulation method. The substrate includes a carrier substrate and at least one auxiliary encapsulation component disposed on the carrier substrate. A protrusion is formed at a side of the auxiliary encapsulation component away from the carrier substrate and protrudes in a direction parallel to the surface of the carrier substrate.

13 Claims, 15 Drawing Sheets

(56) References Cited

U.S. PATENT DOCUMENTS

| | | | | |
|---|---|---|---|---|
| 5,952,037 | A * | 9/1999 | Nagayama | H01L 27/3246 |
| | | | | 427/265 |
| 6,819,041 | B2 * | 11/2004 | Kajiwara | C09K 11/642 |
| | | | | 252/301.4 H |
| 7,557,504 | B2 * | 7/2009 | Tachibana | H01J 11/12 |
| | | | | 313/292 |
| 7,787,092 | B2 * | 8/2010 | Mizusako | G02F 1/133707 |
| | | | | 349/129 |
| 8,004,187 | B2 * | 8/2011 | Tzen | H01L 27/322 |
| | | | | 313/498 |
| 8,624,253 | B2 * | 1/2014 | Yamazaki | G02F 1/13454 |
| | | | | 257/59 |
| 8,830,695 | B2 | 9/2014 | Grespan | |
| 9,450,025 | B2 * | 9/2016 | Jung | H01L 27/2463 |
| 10,366,997 | B2 * | 7/2019 | Yoon | H01L 27/1104 |
| 2005/0206298 | A1 * | 9/2005 | Lee | H01J 9/247 |
| | | | | 313/495 |
| 2007/0120480 | A1 * | 5/2007 | Kwon | H01L 51/524 |
| | | | | 313/512 |
| 2007/0200483 | A1 * | 8/2007 | Jin | H01J 29/006 |
| | | | | 313/495 |
| 2008/0180923 | A1 | 7/2008 | Grespan | |
| 2014/0184059 | A1 * | 7/2014 | Masuda | H01L 51/5246 |
| | | | | 313/512 |
| 2016/0365486 | A1 * | 12/2016 | Kim | H01L 33/382 |

FOREIGN PATENT DOCUMENTS

| | | | | |
|---|---|---|---|---|
| CN | 103943657 | A | 7/2014 | |
| CN | 204230245 | U | 3/2015 | |
| CN | 104538555 | A | 4/2015 | |
| CN | 104882566 | A | 9/2015 | |
| CN | 105679770 | | 6/2016 | |
| CN | 106226958 | | 12/2016 | |
| CN | 106784390 | A | 5/2017 | |
| EP | 0732868 | A1 | 9/1996 | |
| EP | 0732868 | B1 | 5/2000 | |
| KR | 20010084380 | A * | 9/2001 | H01L 51/5246 |

OTHER PUBLICATIONS

First Office Action for Chinese Patent Application No. 201710130775.4 dated Dec. 28, 2017.

Office action from Chinese Application No. 201710130775.4 dated Apr. 10, 2019.

* cited by examiner

SUBSTRATE FOR DISPLAY PANEL, MANUFACTURING METHOD THEREOF, DISPLAY PANEL AND ENCAPSULATION METHOD

CROSS-REFERENCE TO RELATED APPLICATIONS

This application is based upon International Application No. PCT/CN2017/102961, filed on Sep. 22, 2017, which is based upon and claims priority to Chinese patent application No. 201710130775.4 filed on Mar. 6, 2017, the entire contents of which are hereby incorporated by reference.

TECHNICAL FIELD

The present disclosure relates to the technical field of encapsulation, in particular to a substrate for display panel, a manufacturing method thereof, a display panel and an encapsulation method.

BACKGROUND

At present, the traditional organic light-emitting diodes (abbreviated as OLED) display substrate is usually encapsulated by ultraviolet rays (abbreviated as UV) encapsulation method or glass frit encapsulation method. In the existing encapsulation method, the UV glue or the glass frit can be directly filled between a non-display region of the OLED display substrate and an enclosure cover plate, such that the encapsulation of product is achieved.

However, in the above method for encapsulating OLED display substrate in the related technology, the adhesive effect of the encapsulation is poor, thus reducing the lifetime of product.

SUMMARY

The present disclosure provides a substrate for a display panel, manufacturing method thereof, a display panel and an encapsulation method, in order to improve the adhesiveness of the substrate, thus prolonging the lifetime of product.

To achieve the above object, the present disclosure provides a substrate for a display panel, including a carrier substrate and at least one auxiliary encapsulation component disposed on the carrier substrate, a protrusion is formed at a side of the auxiliary encapsulation component away from the carrier substrate and protrudes in a direction parallel to a surface of the carrier substrate.

Optionally, the auxiliary encapsulation component comprises a first sub-component and a second sub-component which are connected with each other, and the second sub-component is disposed on the carrier substrate, and the first sub-component is disposed on a side of the second sub-component away from the carrier substrate, and a portion of the first sub-component protruding relative to the second sub-component in the direction of the surface of the carrier substrate constitutes the protrusion.

Optionally, the substrate further comprises an active layer disposed on the carrier substrate, and the first sub-component and the active layer are disposed at the same layer.

Optionally, the materials of the first sub-component and the second sub-component are inorganic materials.

Optionally, each of four sides of the first sub-component has the protrusion.

Optionally, the carrier substrate is formed with a display region and a non-display region around the display region, and the auxiliary encapsulation component is disposed in the non-display region of the carrier substrate.

Optionally, the auxiliary encapsulation components are disposed in the non-display region in a staggered manner.

To achieve the above purpose, the present disclosure further provides a display panel, comprising a first substrate and a second substrate which are oppositely disposed, and an encapsulation material layer between the first substrate and the second substrate, wherein at least one of the first substrate and the second substrate employs the above substrate for a display panel.

To achieve the above object, the present disclosure further provides method for manufacturing a substrate for a display panel, the method comprises:

forming at least one auxiliary encapsulation component on a carrier substrate; a side of the auxiliary encapsulation component away from the carrier substrate being formed with a protrusion that protrudes in a direction parallel to a direction of a surface of the carrier substrate.

Optionally, the auxiliary encapsulation component comprises a first sub-component and a second sub-component which are connected to each other;

the step of forming at least one auxiliary encapsulation component on a carrier substrate comprises:

depositing a second material layer being on the carrier substrate;

depositing a first material layer on a side of the second material layer away from the carrier substrate; and performing processes of photoresist coating, exposure, developing, twice etchings and photoresist peeling to the first material layer and the second material layer to form at least one first sub-component and a second sub-component corresponding to each of the first sub-components, and a portion of the first sub-component protruding relative to the second sub-component in the direction parallel to the surface of the carrier substrate constitutes the protrusion.

Optionally, the step of performing processes of photoresist coating, exposure, developing, twice etchings and photoresist peeling to the first material layer and the second material layer to form at least one first sub-component and a second sub-component corresponding to each of the first sub-components comprises:

coating photoresist on the first material layer;

placing a mask plate above the carrier substrate, and forming an unexposed portion and an exposed portion by exposing the photoresist through the mask plate;

developing the photoresist after being exposed to remove the exposed portion and retain the unexposed portion;

performing a first etching process to the first material layer and the second material layer corresponding to the exposed portion to remove the first material layer and the second material layer corresponding to the exposed portion to form a first etched pattern and a second etched pattern;

performing a second etching process to the first etched pattern and the second etched pattern corresponding to the unexposed portion to form the first sub-component and the second sub-component;

peeling the unexposed portion of the photoresist.

To achieve the above object, the present disclosure further provides an encapsulation method, comprising:

coating a encapsulation material on a carrier substrate of a first substrate and/or a carrier substrate of a second substrate;

disposing the first substrate and the second substrate oppositely;

curing the encapsulation material to form a encapsulation material layer;

at least one of the first substrate and the second substrate employs the above substrate for a display panel.

Optionally, the encapsulation material layer covers the auxiliary encapsulation component on the carrier substrate of the first substrate and is located between the protrusion of the auxiliary encapsulation component on the carrier substrate of the first substrate and the carrier substrate of the first substrate, and/or, the encapsulation material layer covers the auxiliary encapsulation component on the carrier substrate of the second substrate and is located between the protrusion of the auxiliary encapsulation component on the carrier substrate of the second substrate and the carrier substrate of the second substrate.

DETAILED DESCRIPTION

In order to enable those skilled in the art better understand the technical solution of the present disclosure, a light-emitting instrument and a display device provided by the present disclosure are described in detail in conjunction with the accompanied drawings.

Figure 1:
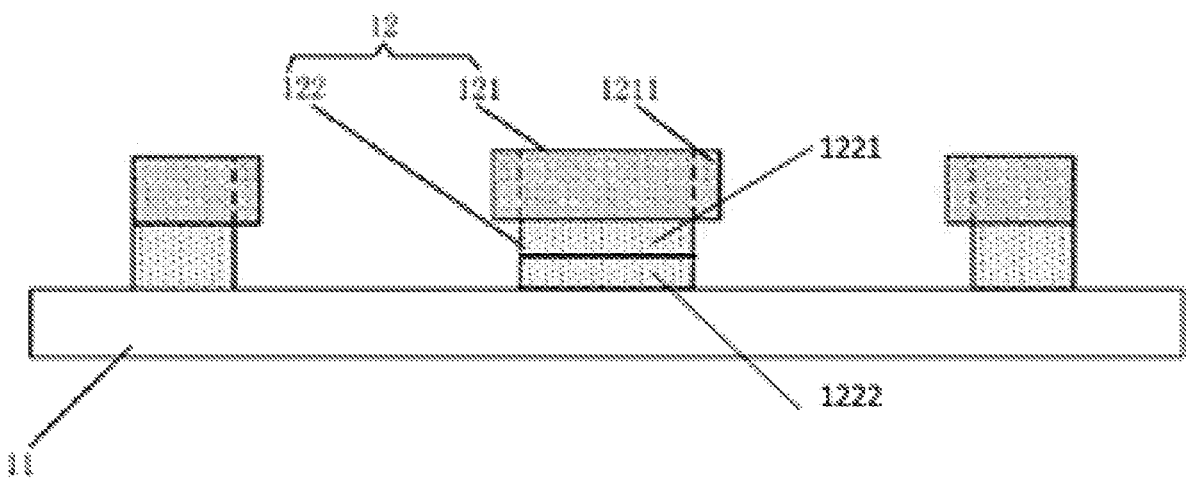
FIG. 1 is a schematic structural view of a substrate for display panel provided by a first embodiment of the present disclosure.
Figure 2:
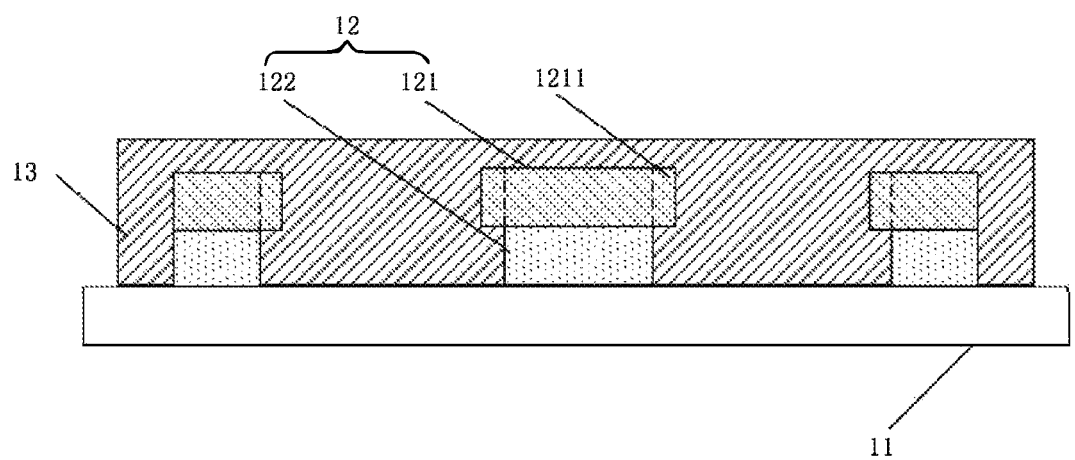
FIG. 2 is schematic view of application of the substrate in the first embodiment.

FIG. 1 is a schematic structural view of a substrate for display panel provided by the first embodiment of the present disclosure. FIG. 2 is schematic view of application of the substrate in the first embodiment. As shown in FIGS. 1 and 2, the substrate includes a carrier substrate 11 and at least one auxiliary encapsulation component 12 disposed on the carrier substrate 11. A protrusion 1211 is provided on a side of the auxiliary encapsulation component 12 away from the carrier substrate 11 and protrudes in a direction parallel to the surface of the carrier substrate 11. In the present embodiment, preferably, there is a plurality of the auxiliary encapsulation components 12.

As shown in FIG. 2, in actual application, an encapsulation material layer 13 is provided between the protrusion 1211 and the carrier substrate 11. The encapsulation material layer 13 is disposed on the carrier substrate 11 and covers the auxiliary encapsulation component 12.

In the present embodiment, preferably, the side of the auxiliary encapsulation component 12 away from the carrier substrate 11 has a width greater than that of the side of the auxiliary encapsulation component 12 close to the carrier substrate 11.

In the present embodiment, preferably, the auxiliary encapsulation component 12 includes a first sub-component 121 and a second sub-component 122 which are connected with each other. The second sub-component 122 is disposed on the carrier substrate 11. The first sub-component 121 is disposed on the side of the second sub-component 122 away from the carrier substrate 11. A portion of the first sub-component 121 protruding relative to the second sub-component 122 in the direction parallel to the surface of the carrier substrate 11 constitutes a protrusion 1211. In the present embodiment, preferably, the first sub-component 121 has a width greater than that of the sub-component 122.

In the present embodiment, preferably, the auxiliary encapsulation component 12 is configured in an inverted stepped structure. That is to say, the second sub-component 122 and the first sub-component 121 are configured in an inverted stepped structure relative to the carrier substrate 11.

Figure 3:
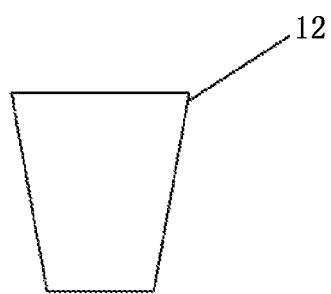
FIG. 3 is a schematic structural view of an auxiliary encapsulation component in the first embodiment.

In the present embodiment, the auxiliary encapsulation component 12 may adopt further structures in other shapes. For example, FIG. 3 is a schematic structural view of the auxiliary encapsulation component in the first embodiment. As shown in FIG. 3, the auxiliary encapsulation component 12 has an inverted trapezoid shape. In addition, it can also be seen from FIG. 3 that the auxiliary encapsulation component 12 is made of a single layer of material. For example, the material of the auxiliary encapsulation component 12 may be a negative photoresist.

In the present embodiment, the substrate for display panel further includes an active layer (not shown in drawings) disposed on the carrier substrate 11. Preferably, the first sub-component 121 and the active layer are disposed at the same layer.

In the present embodiment, the materials of the first sub-component 121 and the second sub-component 122 are inorganic materials. For example, the material of the first sub-component 121 and the second sub-component 122 may be a-Si, SiN, SiO or $SiO_2$. Since the carrier substrate 11 is usually made of inorganic materials, when the first sub-component 121 and the second sub-component 122 are also made of inorganic materials, the adhesive force among the first sub-component 121, the second sub-component 122 and the carrier substrate 11 is rather strong.

In the present embodiment, preferably, the material of the first sub-component 121 is a-Si, and the material of the sub-component 122 is $SiO_2$. In this case, the material of the active layer is a-Si, thereby achieving that the active layer and the first sub-component 121 are disposed at the same layer.

In the present embodiment, the second sub-component 122 can also be a multi-layer structure of inorganic film layer. For example, the second sub-component 122 comprises a first component pattern 1221 and a second component pattern 1222. For example, the first component pattern 1221 is a $SiO_2$ Layer, and the second component pattern 1222 is a SiN layer, i.e., the structure of the second sub-component 122 of the present embodiment is not limited to a single layer structure.

In the present embodiment, preferably, when the second sub-component 122 is a multi-layer structure of an inorganic film layer, the second component pattern 1222 is positioned above the carrier substrate 11, and the first component pattern 1221 is positioned above the second component pattern 1222.

In the present embodiment, preferably, the material of the encapsulation material layer 13 is a UV glue. The encapsulation material Layer 13 can also employ other materials, which is not detailed herein again.

Figure 4:
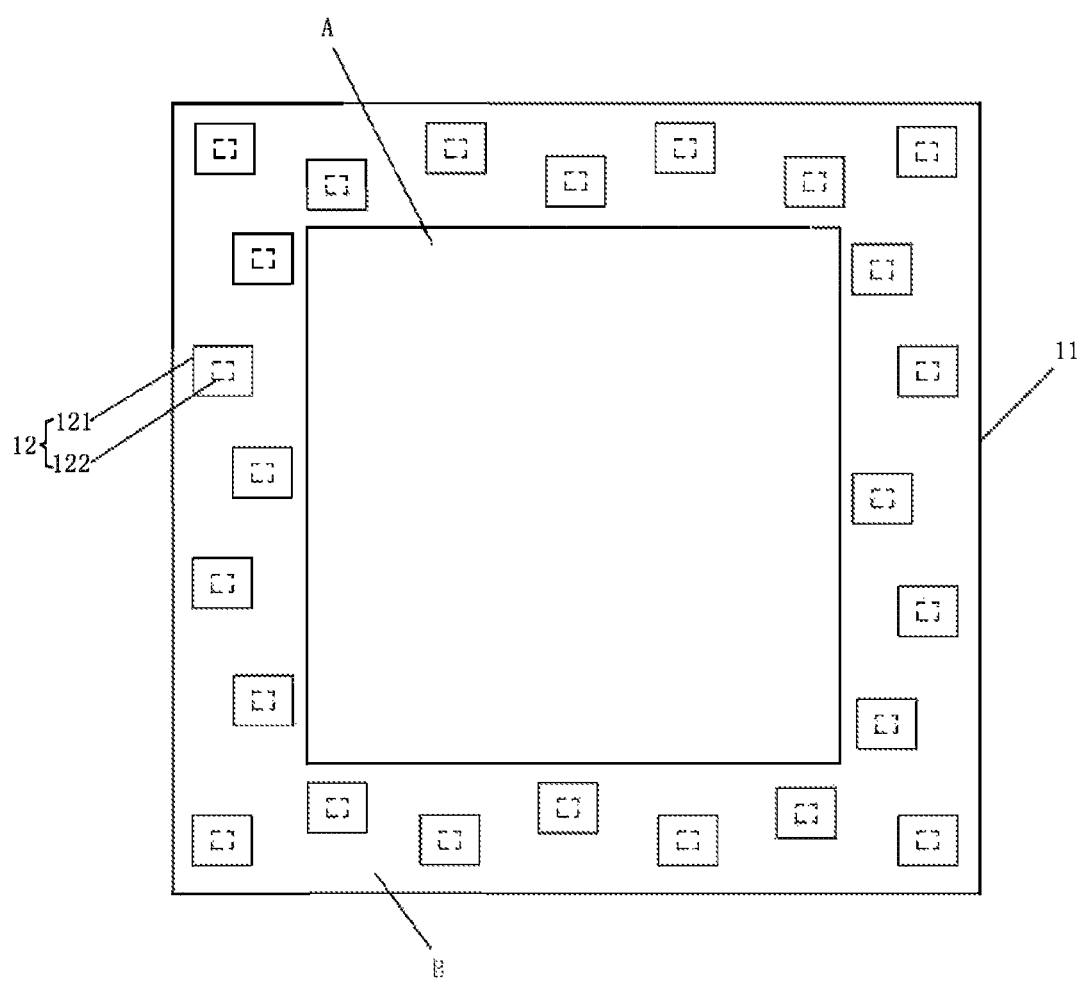
FIG. 4 is a top view of the substrate in FIG. 1.

FIG. 4 is a top view of the substrate in FIG. 1. As shown in FIG. 4, in the present embodiment, the carrier substrate 11 is formed with a display region A and a non-display region B located around the display region A. Preferably, the auxiliary encapsulation components 12 are located in the non-display region B of the carrier substrate 11. In practical application, according to the actual situation, without affecting the display effect, the auxiliary encapsulation components 12 may be disposed in the display region A of the carrier substrate 11. The present embodiment does not set any limit to this arrangement. As can be seen from FIG. 4, the auxiliary encapsulation components 12 are uniformly distributed in the non-display region B, and the auxiliary encapsulation components 12 are disposed in the non-display region B in a staggered manner.

As shown in FIG. 4, in the present embodiment, preferably, each of the four sides of the first sub-component 121 has the protrusion. It should be noted that, there may be a protrusion provided on each of other numbers of sides of the first sub-component 121. For example, one, two, or three sides of the first sub-component 121 have the protrusion. The present embodiment has no restriction on the structure constituting the protrusion.

In the present embodiment, preferably, the substrate for the display panel is an OLED substrate, and the substrate further includes a grid line, a data line, a thin film transistor, a light-emitting instrument, etc., which are not illustrated any more specifically in the drawings.

In the substrate for the display panel provided by the present embodiment, by providing at least one auxiliary encapsulation component on the carrier substrate and by providing the protrusion on the side of the auxiliary encapsulation component away from the carrier substrate, which protrudes in the direction parallel to the surface of the carrier substrate, when an encapsulation material layer is provided between the protrusion and the carrier substrate, the adhesion of the encapsulation is improved, thus enhancing the lifetime of product.

Figure 5:
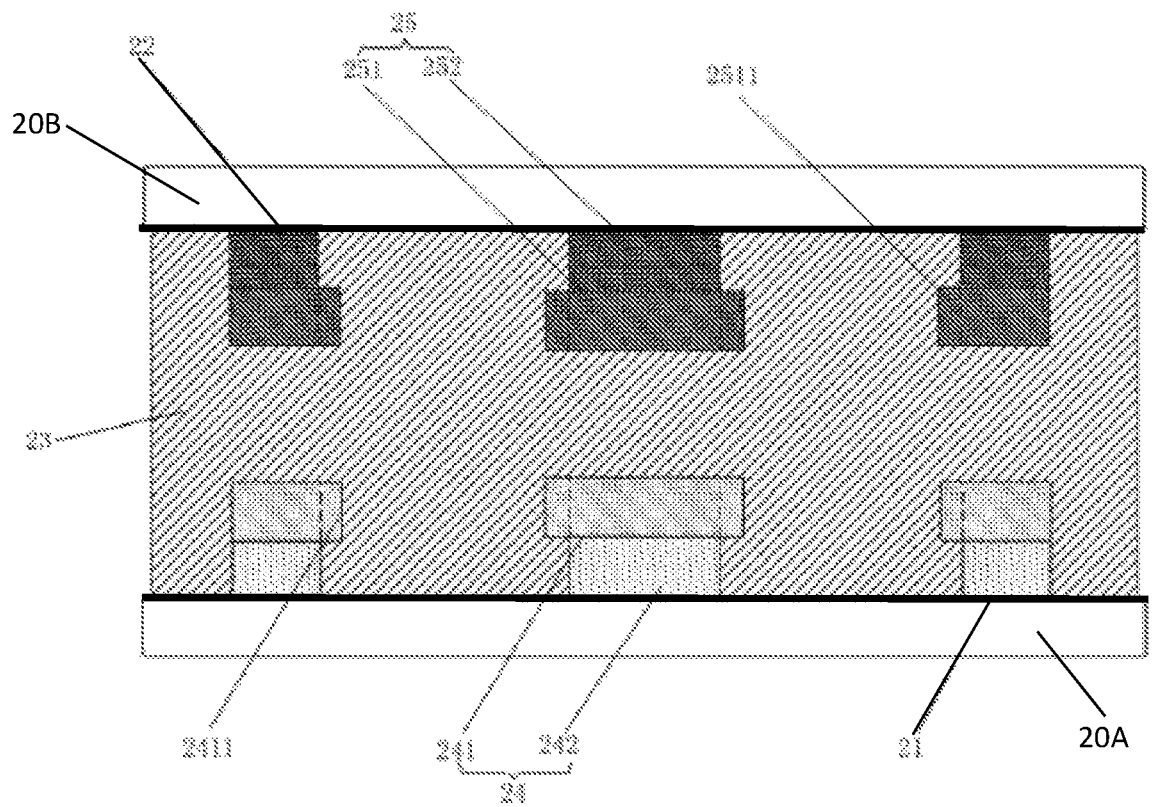
FIG. 5 is a schematic structural view of a display panel provided by a second embodiment of the present disclosure.

FIG. 5 is a schematic structural view of a display panel provided by a second embodiment of the present disclosure. As shown in FIG. 5, the display panel includes the first substrate 20A and the second substrate 20B, which are oppositely disposed, and an encapsulation material layer 23 between a carrier substrate 21 of the first substrate 20A and a carrier substrate 22 of the second substrate 20B.

The first substrate 20A includes the carrier substrate 21 and at least one auxiliary encapsulation component 24 disposed on the carrier substrate 21. A protrusion is provided on a side of the auxiliary encapsulation component 24 away from the carrier substrate 21 and protrudes in a direction parallel to the surface of the carrier substrate 21.

In the present embodiment, preferably, an encapsulation material player 23 is further provided between the protrusion 2411 of the auxiliary encapsulation component 24 of the first substrate 20A and the carrier substrate 21 of the first substrate 20A. As shown in FIG. 5, the encapsulation material layer 23 is located on the carrier substrate 21 of the first substrate 20A and covers the auxiliary encapsulation component 24 of the first substrate 20A.

In the present embodiment, preferably, the side of the auxiliary encapsulation component 24 of the first substrate 20A away from the carrier substrate 21 of the first substrate 20A has a width greater than that of the side of the auxiliary encapsulation component 24 of the first substrate 20A close to the carrier substrate 21 of the first substrate 20A.

Specifically, the auxiliary encapsulation component 24 of the first substrate 20A is located on the side of the carrier substrate 21 of the first substrate 20A close to the second substrate 20B.

The second substrate 20B includes a carrier substrate 22 and at least one auxiliary encapsulation component 25 disposed on the carrier substrate 22. A protrusion 2511 is provided on a side of the auxiliary encapsulation component 25 away from the carrier substrate 22 and protrudes in the direction parallel to the surface of the carrier substrate 22.

In the present embodiment, preferably, an encapsulation material player 23 is further provided between the protrusion 2511 of the auxiliary encapsulation component 25 of the second substrate 20B and the carrier substrate 22 of the second substrate 20B. As shown in FIG. 5, the encapsulation material layer 23 is located on the carrier substrate 22 of the second substrate 20B and covers the auxiliary encapsulation component 25 of the second substrate 20B.

In the present embodiment, preferably, the side of the auxiliary encapsulation component 25 of the second substrate 20B away from the carrier substrate 22 of the second substrate 20B has a width greater than that of the side of the auxiliary encapsulation component 25 of the second substrate 20B close to the carrier substrate 22 of the second substrate 20B.

Specifically, the auxiliary encapsulation component 25 of the second substrate 20B is located on the side of the carrier substrate 22 of the second substrate 20B close to the first substrate 20A.

In the present embodiment, preferably, the auxiliary encapsulation component 24 of the first substrate 20A includes a first sub-component 241 and a second sub-component 122 which are connected with each other. The second sub-component 242 is disposed on the carrier substrate 21 of the first substrate 20A. The first sub-component 241 is disposed on the side of the second sub-component 242 away from the carrier substrate 21. A portion of the first sub-component 241 protruding relative to the second sub-component 242 in the direction parallel to the surface of the carrier substrate 21 constitutes a protrusion 2411.

In the present embodiment, preferably, the first sub-component 241 has a width greater than that of the sub-component 242.

In the present embodiment, preferably, the auxiliary encapsulation component 25 of the second substrate 20B includes a first sub-component 251 and a second sub-component 252 which are connected with each other. The second sub-component 252 is disposed on the side of the carrier substrate 22 of the second substrate 20B close to the first substrate 20A. The first sub-component 251 is disposed on the side of the second sub-component 252 close to the first substrate 20A. A portion of the first sub-component 251 protruding relative to the second sub-component 252 in the direction parallel to the surface of the carrier substrate 22 constitutes a protrusion 2511.

In the present embodiment, preferably, the first sub-component 251 has a width greater than that of the sub-component 252.

In the present embodiment, preferably, the auxiliary encapsulation component 24 of the first substrate 20A and the auxiliary encapsulation component 25 of the second display substrate are configured in an inverted-trapezoid structure. It should be noted that, the inverted-trapezoid structure herein refers to the inverted stepped structure of the auxiliary encapsulation component relative to the carrier substrate of the substrate on which the auxiliary encapsulation component is located.

In the present embodiment, the first substrate 20A further includes an active layer (not shown in drawings) on the carrier substrate 21 of the first substrate 20A. Preferably, the first sub-component 241 of the auxiliary encapsulation component 24 of the first substrate 20A and the active layer of the first substrate 20A are disposed at the same layer. In the present embodiment, preferably, there is a plurality of auxiliary encapsulation components 24 of the first substrate 20A, and there is a plurality of auxiliary encapsulation component 25 of the second substrate 20B.

In the present embodiment, preferably, the auxiliary encapsulation component 24 of the first substrate 20A and the auxiliary encapsulation component 25 of the second substrate 20B have the same size and shape.

In the present embodiment, preferably, the auxiliary encapsulation component 24 on the side of the carrier substrate 21 of the first substrate 20A close to the second substrate 20B and the auxiliary encapsulation component 25 on the side of the carrier substrate 22 close to the first substrate 20A are oppositely disposed. The auxiliary encapsulation component 24 of the first substrate 20A and the auxiliary encapsulation component 25 of the second substrate 20B are disposed in a one-to-one correspondence.

It should be noted that, in the present embodiment, the auxiliary encapsulation component 24 of the first substrate 20A and the auxiliary encapsulation component 25 of the second substrate 20B can also be staggered with each other, which is not illustrated any more in detail. It has no restriction on the position relationship between the auxiliary encapsulation component 24 of the first substrate 20A and the auxiliary encapsulation component 25 of the second substrate 20B in the present embodiment.

Preferably, the projections of the auxiliary encapsulation component 24 of the first substrate 20A and the auxiliary encapsulation component 25 of the second substrate 20B at the carrier substrate 21 of the first substrate 20A are overlapping.

The display panel is formed with a display region and a non-display region located around the display region. Preferably, the auxiliary encapsulation component 24 of the first substrate 20A is located in the non-display region, and the auxiliary encapsulation component 25 of the second substrate 20B is located in the non-display region. In actual application, according to the actual situation, without affecting the display effect, the auxiliary encapsulation component may be disposed in the display region of the display panel. The present embodiment does not set any limit to this arrangement.

In the present embodiment, preferably, the material of the first sub-component 241 of the first substrate 20A and the first sub-component 251 of the second substrate 20B is the same as that of the first sub-component 121 in the first embodiment. The material of the second sub-component 242 of the first substrate 20A and the second sub-component 252 of the second substrate 20B is the same as that of the second sub-component 122 in the first embodiment. Other specific description and illustration may be referred to the first embodiment as described above, and will be omitted here to avoid redundancy. In this case, the material of the active layer of the first substrate 20A is a-Si, thereby achieving that the active layer of the first substrate 20A and the first sub-component 241 of the first substrate 20A are disposed at the same layer.

In the present embodiment, the second sub-component 242 of the first substrate 20A can also be a multi-layer structure of an inorganic film layer. For example, the second sub-component 242 includes a first material sub-layer and the second material sub-layer, wherein the first material sub-layer is a $SiO_2$ Layer, and the second material sub-layer is a SiN layer, i.e., the structure of the second sub-component 242 of the present embodiment is not limited to only a single layer structure.

Preferably, when the second sub-component 242 is a multi-layer structure of an inorganic film layer, the second material sub-layer of the second sub-component 242 is positioned on the carrier substrate 21 of the first base plate, and the first material sub-layer of the second sub-component 242 is positioned above the second material sub-layer of the second sub-component 242.

The second sub-component 252 of the second substrate 20B can also be a multi-layer structure of an inorganic film layer. For example, the second sub-component 252 includes a first component pattern 1221 and the second component pattern 1222, wherein the first component pattern 1221 is a $SiO_2$ Layer, and the second component pattern 1222 is a SiN layer, i.e., the structure of the second sub-component 252 of the present embodiment is not limited to only a single layer structure.

Preferably, when the second sub-component 252 is a multi-layer structure of an inorganic film layer, the second component pattern 1222 of the second sub-component 252 is positioned on the carrier substrate 22 of the second substrate 20B, and the first component pattern 1221 of the second sub-component 252 is positioned on the second component pattern 1222 of the second sub-component 252.

In the present embodiment, preferably, the material of the encapsulation material layer 23 is the same as that of the encapsulation material layer 13 in the first embodiment. The specific description may be referred to the first embodiment as described above, and will be omitted here to avoid redundancy.

In the present embodiment, the auxiliary encapsulation component 24 of the first substrate 20A and the auxiliary substrate 25 of the second substrate 20B may adopt further structures in other shapes. The specific description may be referred to the auxiliary encapsulation component 12 in the first embodiment as described above, and will be omitted here to avoid redundancy.

In the present embodiment, preferably, the first substrate 20A is an OLED display substrate, and the second substrate 20B is a glass substrate.

In the present embodiment, the display panel can be either a flexible display panel or a rigid display panel.

In the display panel provided by the present embodiment, by providing the auxiliary encapsulation component on the carrier substrate of the first substrate 20A and the carrier substrate of the second substrate 20B, and by providing the protrusion on the side of the auxiliary encapsulation component away from the carrier substrate, which protrudes in the direction parallel to the surface of the carrier substrate, when an encapsulation material layer is provided between the protrusion and the carrier substrate, the adhesion of the encapsulation is improved, thus enhancing the lifetime of product.

The third embodiment of the present disclosure provides a display panel, which is different from the display panel provided by Second embodiment in the following aspects: there is not any auxiliary encapsulation component disposed on the carrier substrate of the first substrate 20A, or there is not any auxiliary encapsulation component disposed on the carrier substrate of the second substrate 20B.

Other specific descriptions of the display panel provided by the present embodiment can be referred to the above second embodiment, which will be omitted here to avoid redundancy.

In the display panel provided by the present embodiment, by providing an auxiliary encapsulation component on the carrier substrate of the first substrate 20A or the carrier substrate of the second substrate 20B, and by providing a protrusion on the side of the auxiliary encapsulation component away from the carrier substrate, which protrudes in the direction parallel to the surface of the carrier substrate, when an encapsulation material layer is provided between the protrusion and the carrier substrate, the adhesion of the encapsulation is improved, thus enhancing the lifetime of product.

The fourth embodiment of the present disclosure provides a method for manufacturing a substrate for display panel, including the following:

forming at least one auxiliary encapsulation component on a carrier substrate.

In this step, preferably, a protrusion is provided on a side of the auxiliary encapsulation component away from the carrier substrate and protrudes in a direction parallel to the surface of the carrier substrate.

In the present embodiment, preferably, there is a plurality of the auxiliary encapsulation components.

In the present embodiment, preferably, an encapsulation material layer is provided between the protrusion and the carrier substrate, and the encapsulation material layer is disposed on the carrier substrate and covers the auxiliary encapsulation component.

In the present embodiment, preferably, the side of the auxiliary encapsulation component away from the carrier substrate has a width greater than that of the side of the auxiliary encapsulation component close to the carrier substrate.

In the present embodiment, preferably, the auxiliary encapsulation component includes the first sub-component and the second sub-component which are connected to each other.

Figure 6:
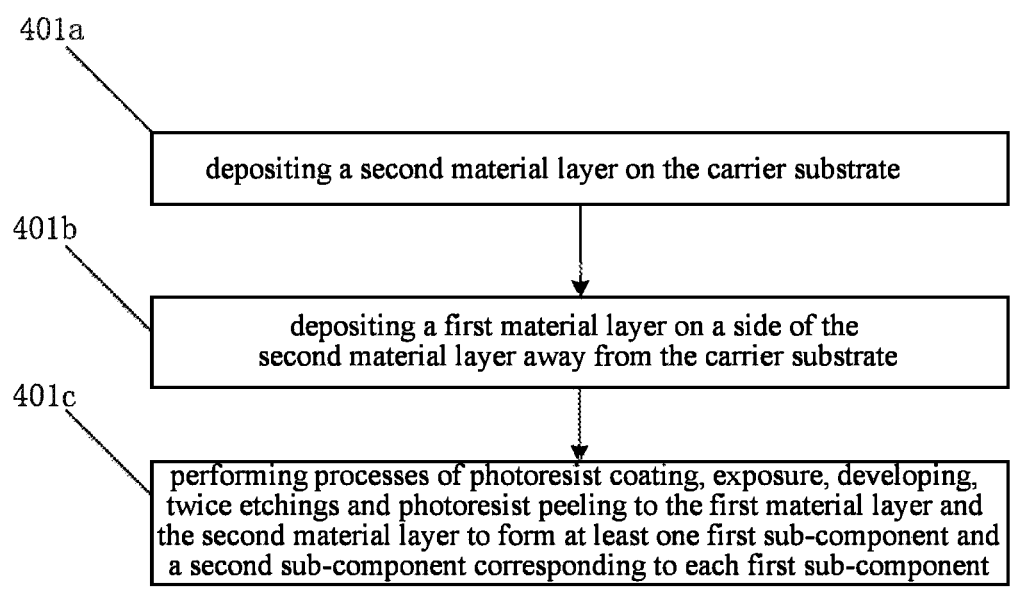
FIG. 6 is a flow diagram of forming at least one auxiliary encapsulation component on a carrier substrate in a fourth embodiment.

FIG. 6 is a flow diagram of forming at least one auxiliary encapsulation component on a carrier substrate in Fourth embodiment. Specifically, forming at least one auxiliary encapsulation component on the carrier substrate includes the following:

Step 401a: depositing a second material layer on the carrier substrate.

Figure 7:
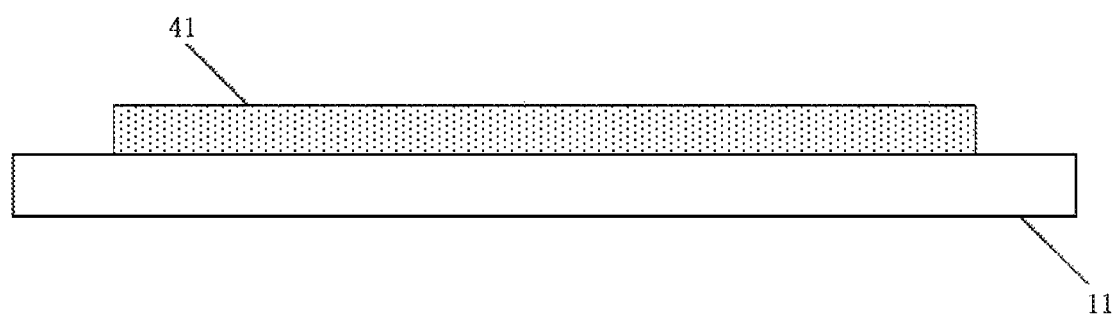
FIG. 7 is a schematic view of forming a second material layer in the fourth embodiment.

As shown in FIG. 7, preferably, the second material layer 41 is deposited on the carrier substrate 11 by a chemical vapor deposition method (abbreviated as CVD). Other method can be used in the present embodiment to deposit the second material layer 41, which is not detailed herein again.

In the present embodiment, the material of the second material layer 41 is inorganic material. Preferably, the material of the second material layer 41 is $SiO_2$.

Step 401b: depositing a first material layer on a side of the second material layer away from the carrier substrate.

Figure 8:
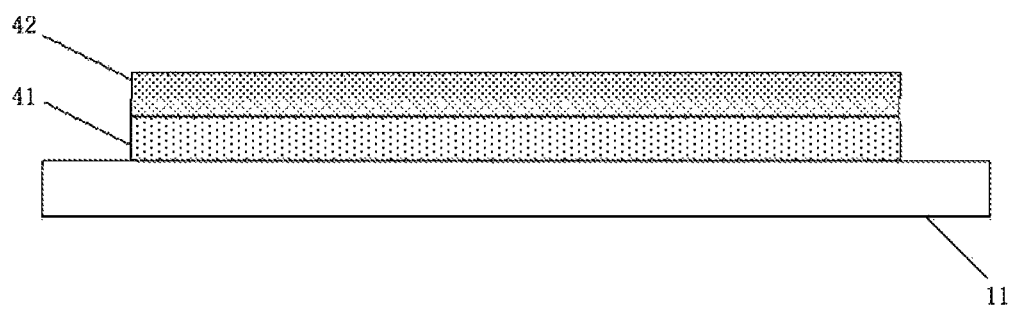
FIG. 8 is a schematic view of forming a first material layer in the fourth embodiment.

As shown in FIG. 8, preferably, the first material layer 42 is deposited on the second material layer 41 by a chemical vapor deposition method. Other method can be used in the present embodiment to deposit the first material layer 42, which is not detailed herein again.

In the present embodiment, the material of the first material layer 42 is inorganic material. Preferably, the material of the first material layer 42 is a-Si.

It should be noted that, the second material layer 41 and the first material layer 42 may also be formed during the deposition of the buffer layer in the backplane process.

Step 401c: performing processes of photoresist coating, exposure, developing, twice etchings and photoresist peeling to the first material layer and the second material layer to form at least one first sub-component and a second sub-component corresponding to each first sub-component, and a portion of the first sub-component protruding relative to the second sub-component in the direction parallel to the carrier substrate constitutes a protrusion.

In the present embodiment, preferably, the first sub-component has a width greater than that of the second sub-component.

Specifically, Step 401c includes the following:

Step 401d: coating photoresist on the first material layer.

Figure 9:
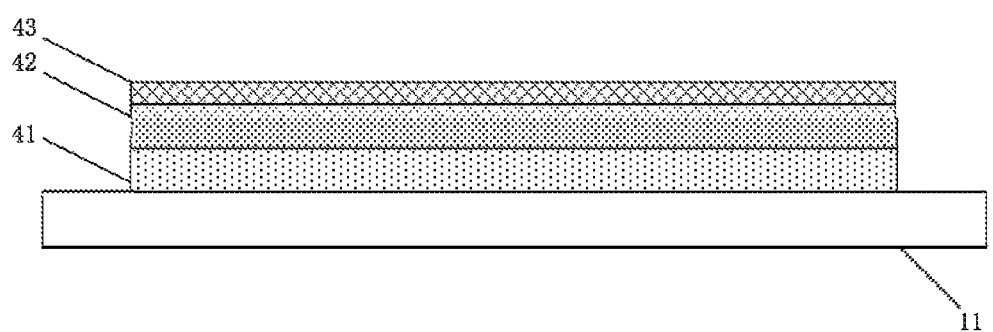
FIG. 9 is a schematic view of applying photoresist in the fourth embodiment.

As shown in FIG. 9, the photoresist 43 covers on the first material layer 42.

Step 401e: placing a mask plate above the carrier substrate; and forming an unexposed portion and an exposed portion by exposing the photoresist through the mask plate.

Figure 10:
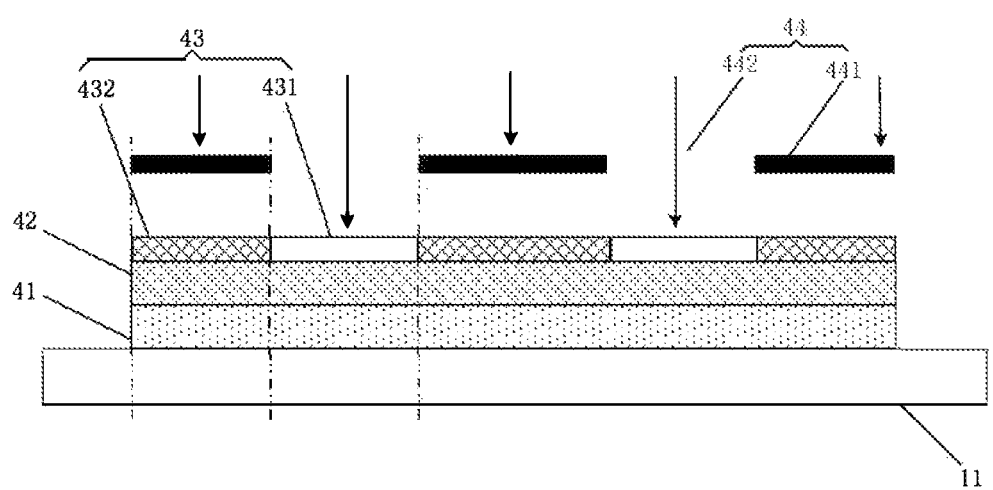
FIG. 10 is a schematic view of performing an exposure process in the fourth embodiment.

As shown in FIG. 10, the mask plate 44 includes the light shielding region 441 and the opening area 442, wherein the light passes through the opening area 442 to be irradiated to the corresponding photoresist 43 to form the exposed portion 431, and the portion of the photoresist 43 corresponding to the light shielding region 441 that shields the light is unexposed portion 432.

Step 401f: developing the photoresist after being exposed to remove the exposed portion and retain the unexposed portion.

Figure 11:
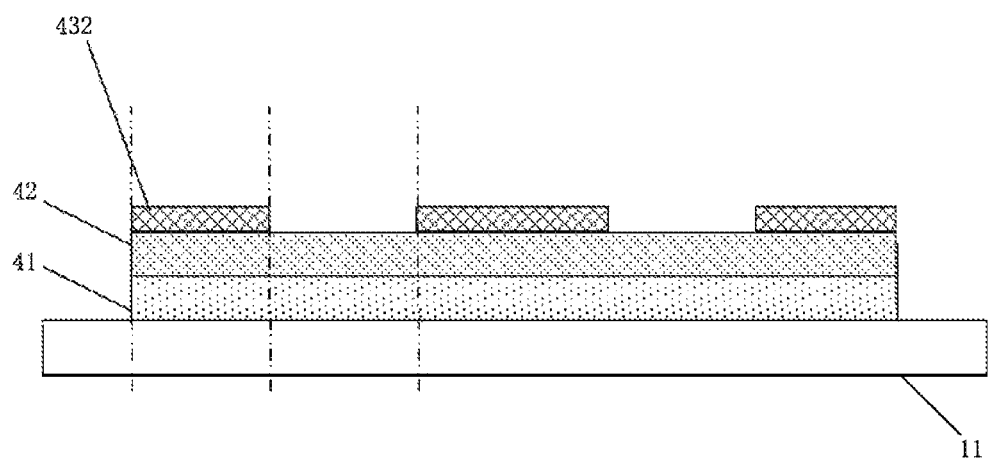
FIG. 11 is a schematic view of performing a developing process in the fourth embodiment.

As shown in FIG. 11, the photoresist 43 is developed after being exposed to remove the exposed portion 431 of the photoresist 43, while the unexposed portion 432 of the photoresist 43 is retained.

Step 401g: performing a first etching process to the first material layer and the second material layer which correspond to the exposed portion to remove the first material layer and the second material layer which correspond to the exposed portion, thus forming the first etched pattern and the second etched pattern.

Figure 12:
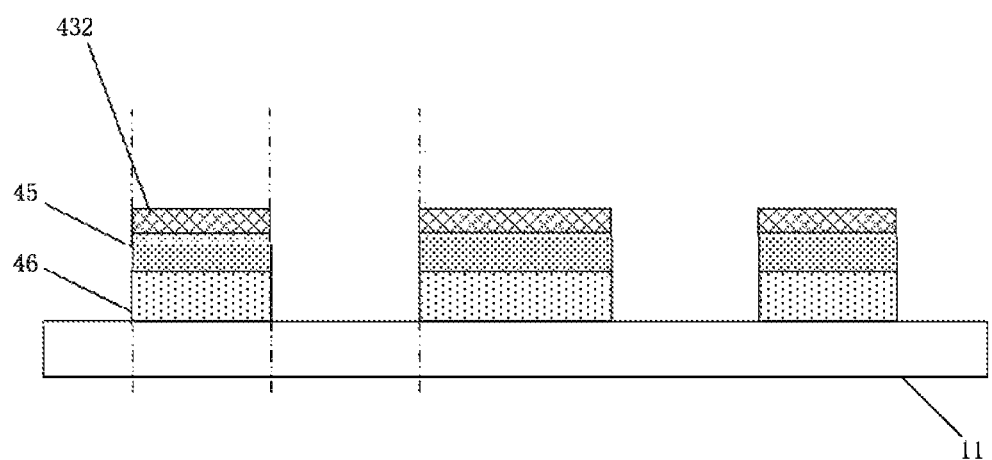
FIG. 12 is a schematic view of performing a first etching process in the fourth embodiment.

As shown in FIG. 12, after removing the exposed portion 431 of the photoresist 43 during developing, the first material layer 42 corresponding to the exposed portion 431 is subjected to the etching to remove the first material layer 42 corresponding to the exposed portion 431, such that the first etched pattern 45 is formed. The second material layer 41 corresponding to the exposed portion 431 is subjected to the etching to remove the second material layer 41 corresponding to the exposed portion 431, such that the second etched pattern 46 is formed.

In this step, preferably, the first etching is a dry etching.

Step 401h: performing a second etching process to the first etched pattern and the second etched pattern which correspond to the unexposed portion to form the first sub-component and the second sub-component.

Figure 13:
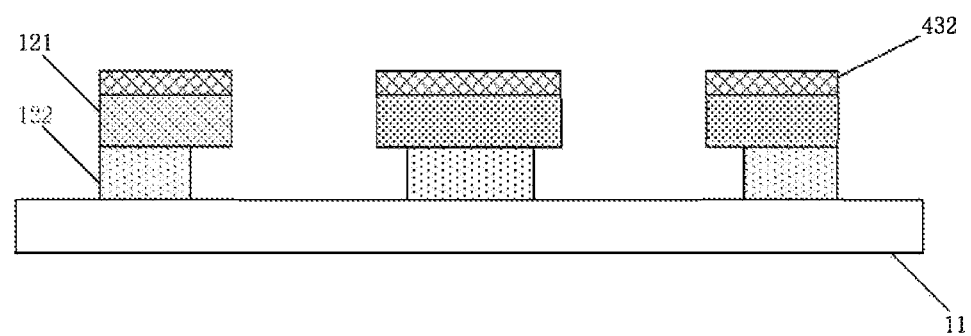
FIG. 13 is a schematic view of performing a second etching process in the fourth embodiment.

As shown in FIG. 13, the first etched pattern 45 and the second etched pattern 46, which are formed after the first etching, are subjected to the second etching. Specifically, the second etching of the present embodiment is a dry etching. According to actual situations, the selectivity of the first etched pattern 45 to the second etched pattern 46 and the bias during the etching are configured in such a manner that the etch rate of the first etched pattern is lower than that of the second etched pattern 46. Therefore, during the second etching, the width of the second etched pattern 46 varies in a relatively large extent, and the width of the first etched pattern 45 varies in a relatively small extent. Therefore, the first sub-component 121 and the second sub-component 122 are formed after the second etching. The projecting portion of the first sub-component 121 relative to the second sub-component 122 in the direction of the carrier substrate constitutes the protrusion 1211, and the first sub-component 121 has a width greater than that of the sub-component 122.

In this step, preferably, when the material of the first etched pattern 45 is a-Si and the material of the second etched pattern 46 is $SiO_2$, appropriate amounts of hydrogen H2, which can extremely reduce the etch rate of a-Si and do not significantly affect the etch rate of $SiO_2$, may be introduced during the second etching process, such that the selectivity of the first etched pattern 45 to the second etched pattern 46 may be controlled by means of hydrogen. In the present embodiment, the first etching and the second etching can be performed continuously in a process chamber to complete the twice etching processes.

It should be noted that, in the ideal state, when the second etching is performed, the first etched pattern 45 is unchanged. That is, the first etched pattern 45 is not further etched.

Step 401i: peeling the unexposed portion of the photoresist.

Figure 14:
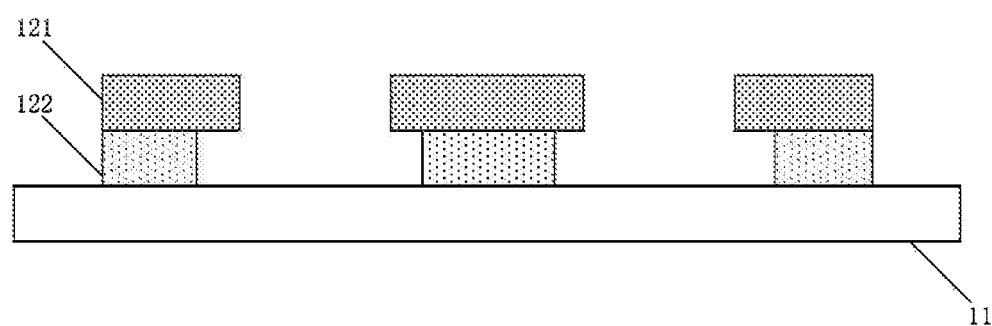
FIG. 14 is a schematic view of peeling an exposed portion of the photoresist in the fourth embodiment.

As shown in FIG. 14, the unexposed portion 432 of the photoresist 43 is peeled to realize to form at least auxiliary encapsulation component on the carrier substrate 11, wherein the auxiliary encapsulation component includes the first sub-component 121 and the second sub-component 122 which are connected to each other.

The method for manufacturing the substrate for the display panel provided by the present embodiment is used to manufacture the substrate for the display panel provided by the first embodiment. Other specific description and illustration of the manufacturing method provided by the present embodiment can be referred to the above the first embodiment, which will be omitted here to avoid redundancy.

In the method for manufacturing the substrate for the display panel provided by the present embodiment, by forming at least one auxiliary encapsulation component on the carrier substrate and by forming the protrusion on the side of the auxiliary encapsulation component away from the carrier substrate, which protrudes in the direction parallel to the surface of the carrier substrate, when an encapsulation material layer is provided between the protrusion and the carrier substrate, the adhesion of the encapsulation is improved, thus enhancing the lifetime of product.

Figure 15:
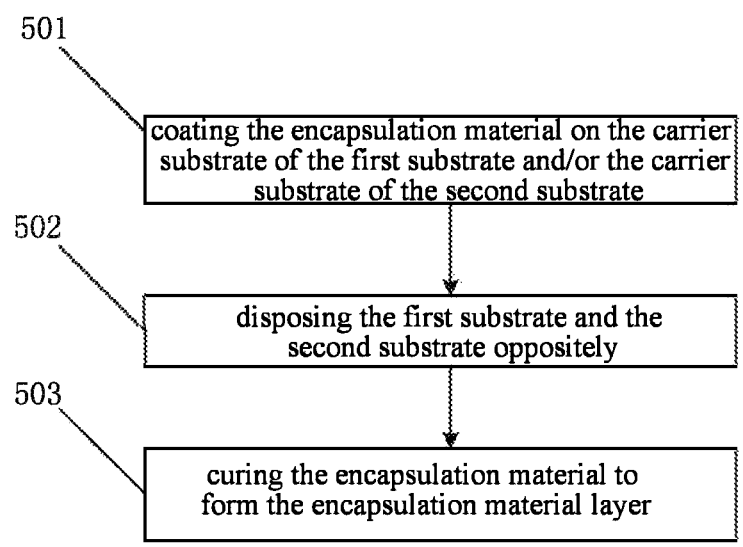
FIG. 15 is a flow diagram of an encapsulation method provided by a fifth embodiment of the present disclosure.

FIG. 15 is a flow diagram of an encapsulation method provided by the fifth embodiment of the present disclosure. As shown in FIG. 15, the method includes the following:

Step 501: coating the encapsulation material on the carrier substrate of the first substrate 20A and/or the carrier substrate of the second substrate 20B.

Step 502, disposing the first substrate 20A and the second substrate 20B oppositely.

Step 503: curing the encapsulation material to form the encapsulation material layer.

In the present embodiment, preferably, at least one of the first substrate 20A and the second substrate 20B employs the substrate provided by the first embodiment. The specific descriptions of the display panel and the second substrate 20B can be referred to the first embodiment, which will be omitted here to avoid redundancy.

In the present embodiment, specifically, the carrier substrate of the first substrate 20A is coated with the encapsulation material; the first substrate 20A and the second substrate 20B are oppositely disposed; a pressure is applied to the encapsulation material in molten state, such that the encapsulation material is squeezed between the protrusion of the auxiliary encapsulation component of the first substrate 20A and the carrier substrate of the first substrate 20A and between the protrusion of the auxiliary encapsulation component of the second substrate 20B and the carrier substrate of the second substrate 20B; and the encapsulation material is subjected to curing, such that the encapsulation material layer is formed between the carrier substrate of the first substrate 20A and the carrier substrate of the second substrate 20B, between the protrusion of the auxiliary encapsulation component of the first substrate 20A and the carrier substrate of the first substrate 20A, and between the protrusion of the auxiliary encapsulation component of the second substrate 20B and the carrier substrate of the second substrate 20B.

In the present embodiment, optionally, by applying the encapsulation material on the carrier substrate of the second substrate 20B or applying the encapsulation material on the carrier substrate of the first substrate 20A and the carrier substrate of the second substrate 20B, a pressure is applied to the encapsulation material in molten state, and the encapsulation material is subjected to curing to form the encapsulation material layer, which will be omitted here to avoid redundancy. It should be noted that, if the first substrate 20A employs the substrate of the first embodiment, the auxiliary encapsulation component on the carrier substrate of the first substrate 20A is covered with the encapsulation material layer, and portion between the protrusion of the auxiliary encapsulation component on the carrier substrate of the first substrate 20A and the carrier substrate of the first substrate 20A is provided with the encapsulation material layer.

If the second substrate 20B employs the substrate of the first embodiment, the auxiliary encapsulation component on the carrier substrate of the second substrate 20B is covered with the encapsulation material layer, and portion between the protrusion of the auxiliary encapsulation component on the carrier substrate of the second substrate 20B and the carrier substrate of the second substrate 20B is provided with the encapsulation material layer.

The encapsulation method provided by the present embodiment is used for manufacturing the display panel of the second embodiment, and other specific description and illustration of the encapsulation method in the present embodiment can be referred to the above Second embodiment, which will be omitted here to avoid redundancy.

In the encapsulation method provided by the present embodiment: the carrier substrate of the first substrate 20A and the carrier substrate of the second substrate 20B are provided with at least one auxiliary encapsulation component; a protrusion is formed on a side of the auxiliary encapsulation component away from the carrier substrate and protrudes in the direction parallel to the carrier substrate; and when a encapsulation material layer is provided between the protrusion and the carrier substrate, the adhesion of the encapsulation is improved, thus enhancing the lifetime of product.

It's understandable that, the above embodiments are only various exemplary embodiments used to describe the principles of the present disclosure, and the present disclosure is not limited to them. Various modifications and variations will be apparent to a person skilled in the art without departing from the scope and spirit of the present disclosure. These modifications and variations are deemed to fall within the protection scope of the present disclosure.

What is claimed is:

1. A substrate for display panel, comprising:
a carrier substrate formed with a display region and a non-display region around the display region, and
at least one auxiliary encapsulation component, disposed on the carrier substrate in the non-display region of the carrier substrate, the auxiliary encapsulation component comprising a first sub-component and a second sub-component connected with each other,
the second sub-component comprising a first component pattern which is a $SiO_2$ layer and a second component pattern which is a SiN layer,
wherein a protrusion is formed at a side of the auxiliary encapsulation component away from the carrier substrate and protrudes in a direction parallel to a surface of the carrier substrate.

2. The substrate according to claim 1, wherein the second sub-component is disposed on the carrier substrate, and the first sub-component is disposed on a side of the second sub-component away from the carrier substrate, and a portion of the first sub-component protruding relative to the second sub-component in the direction of the surface of the carrier substrate constitutes the protrusion.

3. The substrate according to claim 2, further comprising an active layer disposed on the carrier substrate, wherein the first sub-component and the active layer are disposed at the same layer.

4. The substrate according to claim 2, wherein the materials of the first sub-component and the second sub-component are inorganic materials.

5. The substrate according to claim 2, wherein each of four sides of the first sub-component has the protrusion.

6. The substrate according to claim 1, wherein the auxiliary encapsulation components are disposed in the non-display region in a staggered manner.

7. An encapsulation method, comprising:
coating an encapsulation material on a carrier substrate of a first substrate and/or a carrier substrate of a second substrate;
disposing the first substrate and the second substrate oppositely;
curing the encapsulation material to form an encapsulation material layer;
wherein at least one of the first substrate and the second substrate employs the substrate according to claim 1.

8. The encapsulation method according to claim 7, wherein,
the encapsulation material layer covers the auxiliary encapsulation component on the carrier substrate of the first substrate and is located between the protrusion of the auxiliary encapsulation component on the carrier substrate of the first substrate and the carrier substrate of the first substrate.

9. The encapsulation method according to claim 7, wherein,
the encapsulation material layer covers the auxiliary encapsulation component on the carrier substrate of the second substrate and is located between the protrusion of the auxiliary encapsulation component on the carrier substrate of the second substrate and the carrier substrate of the second substrate.

10. A display panel, comprising:
a first substrate and a second substrate, oppositely disposed, and
an encapsulation material layer between the first substrate and the second substrate, wherein at least one of the first substrate and the second substrate employs a carrier substrate formed with a display region and a non-display region around the display region, and
at least one auxiliary encapsulation component, disposed on the carrier substrate in the non-display region of the carrier substrate, the auxiliary encapsulation component comprising a first sub-component and a second sub-component connected with each other,
the second sub-component comprising a first component pattern which is a $SiO_2$ layer and a second component pattern which is a SiN layer,
wherein a protrusion is formed at a side of the auxiliary encapsulation component away from the carrier substrate and protrudes in a direction parallel to a surface of the carrier substrate.

11. A method for manufacturing a substrate for a display panel, comprising:
forming at least one auxiliary encapsulation component on a carrier substrate; a side of the auxiliary encapsulation component away from the carrier substrate being formed with a protrusion that protrudes in a direction parallel to a direction of a surface of the carrier substrate.

12. The method according to claim 11, wherein the auxiliary encapsulation component comprises a first sub-component and a second sub-component which are connected to each other;
wherein the step of forming at least one auxiliary encapsulation component on a carrier substrate comprises:
depositing a second material layer being on the carrier substrate;
depositing a first material layer on a side of the second material layer away from the carrier substrate; and
performing processes of photoresist coating, exposure, developing, twice etchings and photoresist peeling to the first material layer and the second material layer to form at least one first sub-component and a second sub-component corresponding to each of the first sub-components, and a portion of the first sub-component protruding relative to the second sub-component in the direction parallel to the surface of the carrier substrate constitutes the protrusion.

13. The method according to claim 12, wherein the step of performing processes of photoresist coating, exposure, developing, twice etchings and photoresist peeling to the first material layer and the second material layer to form at least one first sub-component and a second sub-component corresponding to each of the first sub-components comprises:
coating photoresist on the first material layer;
placing a mask plate above the carrier substrate, and forming an unexposed portion and an exposed portion by exposing the photoresist through the mask plate;
developing the photoresist after being exposed to remove the exposed portion and retain the unexposed portion;
performing a first etching process to the first material layer and the second material layer corresponding to the exposed portion to remove the first material layer and the second material layer corresponding to the exposed portion to form a first etched pattern and a second etched pattern;

performing a second etching process to the first etched pattern and the second etched pattern corresponding to the unexposed portion to form the first sub-component and the second sub-component;

peeling the unexposed portion of the photoresist.

* * * * *